(12) United States Patent
Liu et al.

(10) Patent No.: US 8,035,201 B2
(45) Date of Patent: Oct. 11, 2011

(54) RELIABLE INTERCONNECTION

(75) Inventors: Huang Liu, Singapore (SG); Jack Cheng, Nanjing (CN); Wei Lu, Singapore (SG); Yihua Wang, Singapore (SG); Meisheng Zhou, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 149 days.

(21) Appl. No.: 12/473,232

(22) Filed: May 27, 2009

(65) Prior Publication Data

US 2010/0301461 A1    Dec. 2, 2010

(51) Int. Cl.
*H01L 23/00* (2006.01)

(52) U.S. Cl. ............ 257/632; 257/E23.002; 257/660; 438/118; 438/622

(58) Field of Classification Search .......... 257/692, 257/E21.499, E23.171, E23.141, 632; 174/255; 438/121, 118, 622, 761, 780
See application file for complete search history.

(56) References Cited

U.S. PATENT DOCUMENTS

| 7,253,125 | B1 * | 8/2007 | Bandyopadhyay et al. .. 438/795 |
| 7,482,265 | B2 * | 1/2009 | Chen et al. .................... 438/637 |
| 7,851,232 | B2 * | 12/2010 | van Schravendijk et al. ..... 438/4 |

* cited by examiner

*Primary Examiner* — Roy K Potter
(74) *Attorney, Agent, or Firm* — Horizon IP Pte Ltd (57) ABSTRACT

Embodiments relate to a method for forming reliable interconnects by the use of a device layer that can serve as a barrier or an etch stop layer, among other applications. The device layer is UV resistant in that its dielectric constant and stress remain stable or relatively stable when subjected to UV curing.

20 Claims, 7 Drawing Sheets

RELIABLE INTERCONNECTION

BACKGROUND

The fabrication of integrated circuits (ICs) involves the formation of features on a substrate that make up circuit components, such as transistors, resistors and capacitors. The devices are interconnected, enabling the IC to perform the desired functions. Interconnections are formed by forming contacts and conductive lines in a dielectric layer using, for example, damascene techniques. A damascene structure, for example, includes a via or contact hole in a lower portion and a trench which is generally wider than the contact hole in an upper portion. The via serves as a contact to a device while the trench contains the conductive line for connecting the device to, for example, other devices.

As critical dimensions (CD) continue to shrink, RC delay contributed by back-end-of line (BEOL) interconnect becomes more and more significant. In the effort to introduce lower k dielectrics for BEOL interconnect, materials such as porous ultra low k (ULK) inter level dielectric (ILD) and lower k $SiC_xN_yH_z$ Cu barrier material have been proposed. With the use of ULK dielectrics, UV curing is required. UV curing is used to form pores to lower the dielectric constant of the film. Additionally, UV curing enhances the mechanical strength of the film.

However, conventional $SiC_xN_yH_z$ films have been found to be unstable when exposed to UV. For example, exposure to UV has been found to cause the dielectric constant of the $SiC_xN_yH_z$ film to increase, the film stress to convert from compressive to tensile, and even cracking of the film which negatively impacts performance and reliability.

From the foregoing discussion, it is desirable to provide a method for forming a Cu barrier with low dielectric constant and high UV resistance.

SUMMARY

Embodiments relate to a method for forming reliable interconnects. The method comprises forming a device by preparing a substrate with circuit components, forming a doped device layer on the substrate, forming an interlevel dielectric layer on the doped device layer, and exposing the substrate with UV radiation to cure the interlevel dielectric layer, wherein properties of the doped device layer remain stable when exposed to UV radiation.

In one embodiment, the doped device layer comprises a low k dielectric layer doped with —$CH_3$. In one embodiment, the doped device layer comprises $(CH_3)_nSiC_xN_yH_z$ and the dielectric layer comprises an ULK layer. In one embodiment, properties of the doped device layer that remain stable include the dielectric constant and stress of the doped device layer.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

In the following description, various embodiments of the present invention are described with reference to the following drawings, in which.

DETAILED DESCRIPTION

Embodiments generally relates to devices, such as semiconductor devices or ICs. Other types of devices, such as micro electromechanical systems (MEMS), liquid crystal displays, are also useful. The ICs can be any type of IC, for example dynamic or static random access memories, signal processors, or system-on-chip devices. The ICs can be incorporated into, for example, consumer electronic products, such as computers, cell phones, and personal digital assistants (PDAs).

One embodiment relates to a device layer. The device layer can serve as a barrier or etch stop layer. For example, the device layer can serve as a copper barrier layer in ULK applications. Other applications of the device layer may also be useful. The device layer, in one embodiment, comprises a dielectric material. In one embodiment, the device layer comprises a UV resistant dielectric material. Preferably, the UV resistant dielectric material comprises a low k material. The low k dielectric material, for example, comprises a k which is ≦4.5. Providing a low k dielectric material with other k values is also useful. When subjected to UV curing, the properties of the device layer remain stable or relatively stable. In particular, the dielectric constant of the device layer remains stable or relatively stable. Preferably, the dielectric constant of the device layer remains at ≦4.5. Additionally, the stress of the device layer remains stable or relatively stable when exposed to UV radiation.

In one embodiment, the device layer comprises doped $SiC_xN_yH_z$. Various types of $SiC_xN_yH_z$ materials can be used. The dopant in the doped $SiC_xN_yH_z$ stabilizes the device layer when exposed to UV radiation, such as from UV curing. In one embodiment, the $SiC_xN_yH_z$ is doped with —$CH_3$ (methyl). In one embodiment, the device layer comprises $(CH_3)_nSiC_xN_yH_z$. Other types of dopants which stabilize the device layer when exposed to UV radiation are also useful.

The amount of dopants affects the resulting k of the device layer. Generally, the higher the concentration, the lower the k value and vice versa. In one embodiment, concentration of dopants in the device layer is sufficient to produce a k value of ≦4.5. In one embodiment, the atomic concentration of C in the $(CH_3)_nSiC_xN_yH_z$ is in the range of about 15%-40%, preferably in the range of about 20%-35%. The atomic concentration of H in the $(CH_3)_nSiC_xN_yH_z$ is in the range of about 25%-50%, preferably in the range of about 30%-40%. Providing dopants in other amounts to produce a device layer with other k values is also useful.

Doping the device layer with —$CH_3$ has been found to stabilize the device when exposed to UV radiation. For example, the —$CH_3$ doped device layer maintains its dielectric constant after being subjected to UV curing. In one embodiment, the dielectric constant of the doped device layer remains stable or relatively stable even after exposure to UV radiation after about 30-300 seconds at about 400° C. In another embodiment, the dielectric constant of the doped device layer remains stable or relatively stable after at least 300 seconds at about 400° C. of exposure to UV radiation. For example, the dielectric constant of the doped device layer remains stable or relatively stable after 300-600 seconds at about 400° C. of exposure to UV radiation.

In one embodiment, the device layer is formed by chemical vapor deposition (CVD). Preferably, the device layer is formed by plasma enhanced CVD (PECVD). Other deposition techniques, such as plasma enhanced atomic layer deposition CVD (PE ALD CVD) or high density plasma CVD (HDP CVD), are also useful.

To form the device layer, the various precursors are provided into the reaction chamber. For example, $SiC_xN_yH_z$ can be formed with 3-methyl-silane $(CH_3)_3SiH$ or 4-methyl-silane $(CH_3)_4Si$ with $NH_3$ precursors. Carrier gases may be employed in the formation of the $SiC_xN_yH_z$ device layer. The precursors are injected into, for example, the CVD chamber and reacted to form the device layer.

To dope the device layer, a dopant source is provided. In one embodiment, the dopant source is provided in-situ. Other techniques of providing the dopant source or dopants may also be useful. In one embodiment, the dopant source or dopant specie —$CH_3$ is provided by an alkyl precursor.

The dopant source, in one embodiment, can be an alkyl precursor delivered to the reaction chamber with the other precursors and carrier gases. The following illustrates the reaction to form the doped device layer in accordance with various embodiments:

$(CH_3)_3SiH+NH_3+Alkyl \rightarrow (CH_3)_nSiC_xN_yH_z$; or $(CH_3)_4SiH+NH_3+Alkyl \rightarrow (CH_3)_nSiC_xN_yH_z$.

Any alkyl precursor containing —$CH_3$ specie can be employed. Preferably, the alkyl precursor is selected from those which are conducive to CVD. More preferably, the alkyl precursor is selected from those which are conducive to PECVD. For example, the alkyl precursor should be small in molecular size in the gas phase at room temperature or have high vapor pressure in the liquid phase at room temperature. In one embodiment, the alkyl precursor can include $H_nC(CH_3)_{4-n}$ (n=0-4), $H_n(CH_3)_3$, C—$CH_n'(CH_3)_{3-n}$(n=0-3, n'=0-3), or RC—CR'alkyl. Other types of alkyl precursors may also be useful.

In one embodiment, the doped device layer is formed as follows:

| | |
|---|---|
|  $(CH_3)_3SiH$ or $(CH_3)_4Si$ | 50-1000 sccm; |
| $NH_3$ | 100-2000 sccm; |
| Alkyl precursor | 100-2000 sccm; |
| He or $N_2$ | 300-5000 sccm; |
| RF power | 50-1500 W; and |
| Pressure | 1.0-7.0 Torr. |

Not wishing to be bound by theory, it is believed that the doping of $SiC_xN_yH_z$ with —$CH_3$ specie instead of other species such as —$CH_2$ or —CH species reduces decomposition of the $SiC_xN_yH_z$ layer caused by UV radiation. The decomposition releases H which converts to Si—C. Si—C has a dielectric constant of about 5.5-7. As such, the decomposition of $SiC_xN_yH_z$ results in an increase in dielectric constant. Furthermore, the Si—C also causes an increase in leakage. However, Si—$CH_3$ has been found to be stable when exposed to UV radiation.

Figure 1:
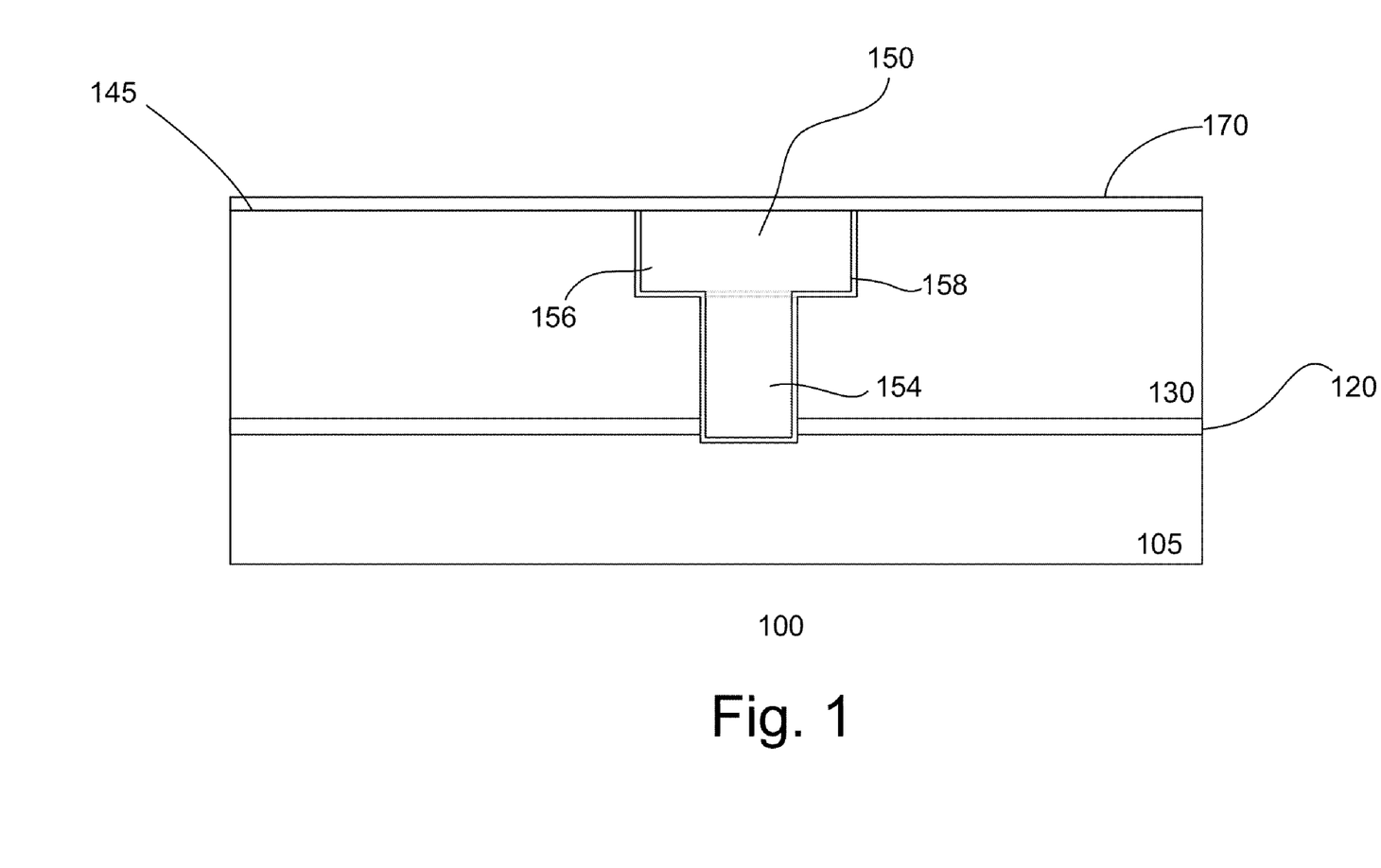
FIG. 1 shows application of an embodiment of a device layer.

FIG. 1 shows an application of the —$CH_3$ doped barrier layer. As shown is a cross-sectional view of a portion of device, such as an integrated circuit (IC) 100. Other types of devices are also useful. The portion includes a substrate 105.

The substrate, for example, comprises a silicon substrate. Other types of substrates, such as silicon germanium or silicon-on-insulator (SOI), are also useful. The substrate may include circuit components (not shown) such as transistors, capacitors, or resistors formed thereon. Other types of circuit components are also useful.

A dielectric layer 130 may be disposed on the substrate. The dielectric layer, for example, serves as an interconnect dielectric (ICD) layer in which interconnects are formed. The interconnects provide the desired interconnections for the different circuit components. A lower etch stop layer 120 can be provided beneath the ICD layer. The lower etch stop layer, in one embodiment, comprises a UV resistant device layer. For example, the lower etch stop layer comprises a —$CH_3$ doped device layer. In one embodiment, the device layer comprises a —$CH_3$ doped layer, such as $(CH_3)_nSiC_xN_yH_z$. The thickness of the lower etch stop layer can be about 250-500 Å. Other thicknesses are also useful.

The dielectric layer, in one embodiment, comprises a low k or ultra low k dielectric material. Various types of low k or ultra low k materials, such as SiCOH or porous SiCOH (e.g., Black Diamond) or organo-silicate glass (OSG), can be employed. Other types of dielectric materials are also useful.

In one embodiment, the ICD includes lower and upper portions. The lower portion serves as an inter-level dielectric (ILD) layer while the upper portion serves as an intra-metal dielectric (IMD) layer. The dielectric layer can be a single layer or multi-layered stack. For example, a single layer can be used to serve as both the ILD and IMD or separate layers can be used for the ILD and IMD. For multi-layered ICD, the ILD and IMD can comprise the same or different materials. In some cases, an etch stop layer (not shown) can be disposed between the ILD and IMD. The etch stop layer, for example, can be a UV resistant etch stop layer. In one embodiment, the UV resistant etch stop layer comprises a —$CH_3$ doped etch stop layer, for example, $(CH_3)_nSiC_xN_yH_z$. The ICD layer can represent any interconnect level of the device. For example, the ICD layer can be M1, M2, etc.

An interconnect 150 may be formed in the ICD layer. The IC can include numerous interconnects. In one embodiment, the interconnect comprises a conductive line 156 in the upper portion or IMD while a contact 154 is disposed in the lower portion or ILD. The interconnect comprises a conductive material. For example, the conductive material can be any metal or alloy. In one embodiment, the interconnect can comprise copper, aluminum, tungsten, their alloys, or a combination thereof. It is understood that the contacts and conductive line can comprise the same or different materials. The contact connects the conductive line to a contact region below. For example, depending on the ICD level or design, the contact region can be another metal line or a device, such as a diffusion region or a gate of a transistor or a plate of a capacitor.

A barrier 158 can be provided to line the sidewalls and bottom of the interconnect. The barrier serves to protect the conductive line from diffusing into the dielectric layer. The barrier, for example, can comprise titanium nitride (TiN). Other types of barrier materials, such as TaN, tantalum, ruthenium or a combination thereof, including TiN, are also useful.

The conductive lines and/or contacts can be provided with slanted sidewalls. The slanted sidewall profile provides better sidewall barrier and seed coverage during processing. The slanted sidewalls, for example, comprise an angle of about 85-90°. Providing conductive lines and/or contacts with non-slanted sidewalls is also useful.

In one embodiment, an upper barrier layer 170 is disposed on the surface of the ICD layer and the interconnect. The upper barrier layer can also serve as an etch stop or capping layer. In one embodiment, the upper barrier layer comprises a UV resistant layer. The UV resistant layer comprises a $CH_3$ doped layer. For example, the UV resistant layer comprises $(CH_3)_n SiC_x N_y H_z$. The thickness of the upper barrier layer can be about 200-500 Å. Other thicknesses are also useful.

Figure 2A:
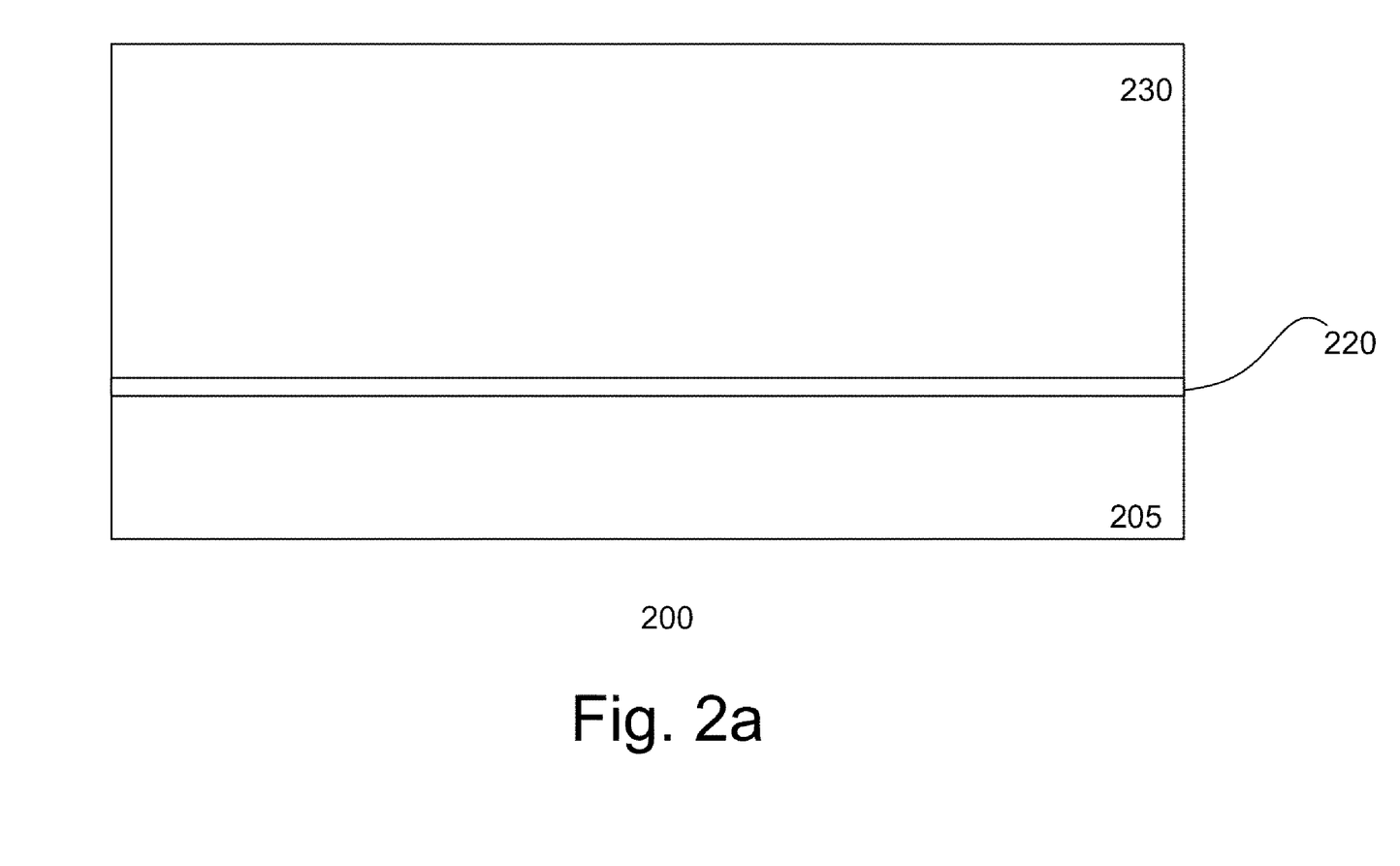
FIGS. 2a-e show an embodiment of a process of forming a device.

FIGS. 2a-e show a process for forming a portion 200 of a device, such as an IC in accordance with one embodiment. Referring to FIG. 2a, a substrate 205 is provided. The substrate, in one embodiment, comprises a p-type silicon substrate. Other types of substrates, such as a germanium-based, gallium arsenide, silicon-on-insulator (SOI), or sapphire substrate, are also useful. The substrate can be prepared with circuit components (not shown). Circuit components can include, for example, transistors, capacitors and/or resistors. Other types of circuit components are also useful.

The substrate is further prepared with a dielectric layer 230. The dielectric layer, for example, serves as an ICD layer. A lower etch stop layer 220 can be provided beneath the ICD layer. The lower etch stop layer, in one embodiment, comprises a UV resistant device layer. For example, the lower etch stop layer comprises a $—CH_3$ doped device layer. In one embodiment, the device layer comprises $(CH_3)_n SiC_x N_y H_z$. The thickness of the lower etch stop layer can be about 150-500 Å. Other thicknesses are also useful.

In one embodiment, the dielectric layer includes an upper or IMD portion and a lower or ILD portion. The dielectric layer can be a single layer or multi-layered stack. For example, a single layer can be used to serve as both the ILD and IMD or separate layers can be used for the ILD and IMD. In some cases, an etch stop layer (not shown) can be disposed between the ILD and IMD. The etch stop layer can comprise $(CH_3)_n SiCN_y H_z$. Other types of etch stop layer may also be useful.

In one embodiment, the dielectric layer comprises a low k or ULK dielectric material. Various types of low k or ULK materials, such as SiCOH or OSG, can be employed. Other types of dielectric materials containing progens are also useful.

The ICD layer or layers can be deposited using various types of deposition techniques. For example, chemical vapor deposition (CVD) processes such as plasma enhanced (PECVD), high density (HDCVD), atmospheric pressure (APCVD) can be used. Other techniques such as spin-on processes are also useful. The specific process, for example, can depend on the type of material used and the application.

In one embodiment, the ICD layer can be cured by UV. Exposure to UV removes the progens trapped inside the ICD layer. This generates pores which reduces the dielectric constant of the ICD layer. Additionally, the UV radiation increases the density of the ICD layer. The UV curing can be performed at a temperature of about 200-500° C. and preferably about 300-400° C. for about 30-600 seconds.

Due to UV light transparency in the ICD layer, the underlying etch stop layer will also be cured by the UV radiation simultaneously. In accordance with one embodiment, the underlying etch stop layer comprises a stable etch stop layer when exposed to UV radiation. In one embodiment, the underlying etch stop layer comprises $(CH_3)_n SiC_x N_y H_z$.

Figure 2B:
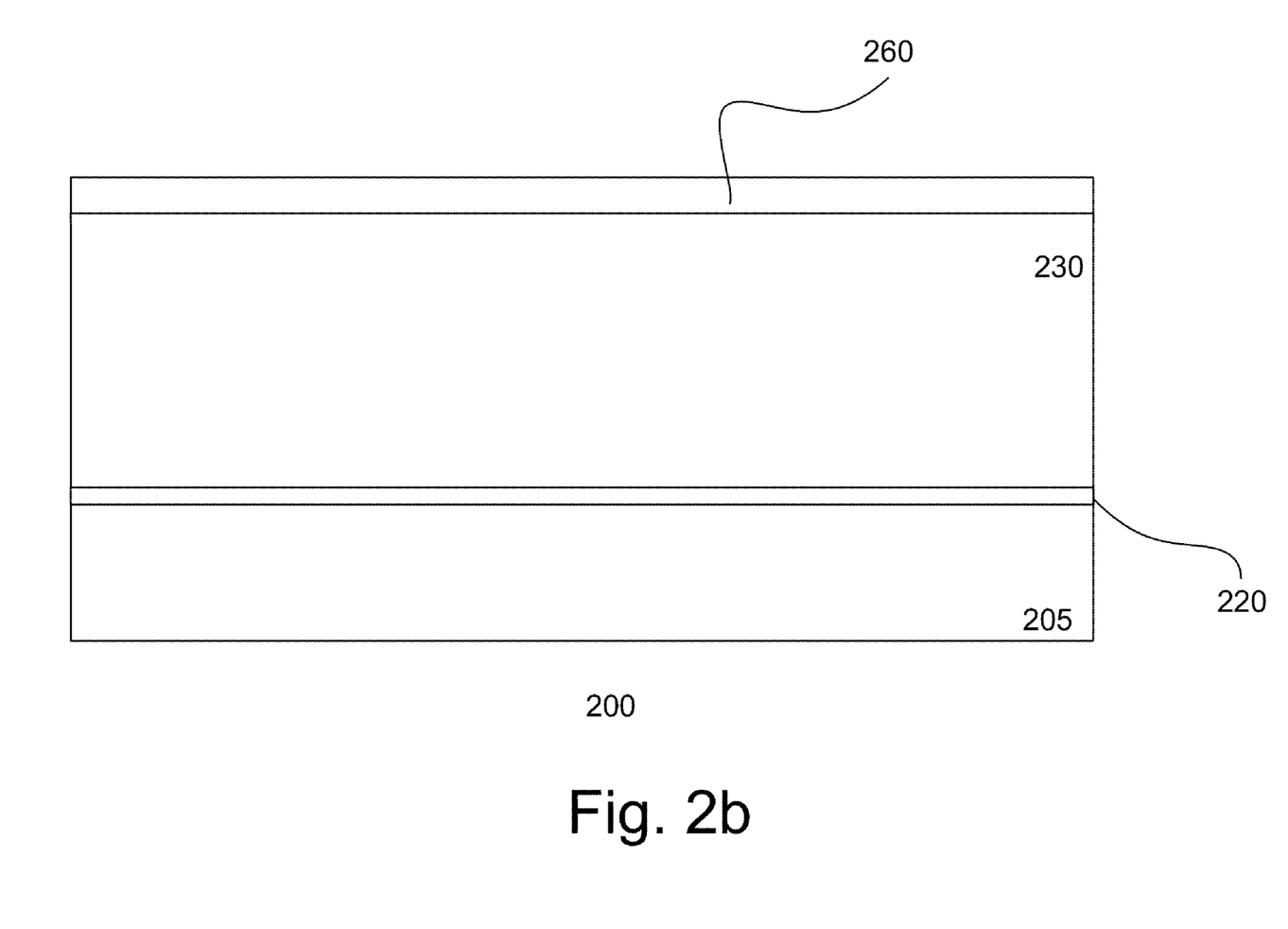

Referring to FIG. 2b, a mask layer 260 is formed over dielectric layer 230. In one embodiment, the mask layer 260 comprises multiple sub-mask layers. Providing a single mask layer is also useful. Other types of mask configurations are also useful.

In one embodiment, the mask layer comprises a hard sub-mask layer and a soft sub-mask layer. The hard sub-mask layer is deposited on the dielectric layer. The hard sub-mask layer, for example, comprises silicon nitride. Other types of hard mask materials, such as TEOS, are also useful. The hard sub-mask layer can be formed by, for example, PE CVD. Other techniques for forming the hard sub-mask layer are also useful. The hard mask layer is about 150-800 Å thick. Other thicknesses are also useful.

Above the hard sub-mask layer is a soft sub-mask layer. In one embodiment, the soft sub-mask layer comprises photo-resist. The photo-resist, for example, can be formed by various techniques, such as spin-on. Other techniques are also useful. The thickness of the soft sub-mask layer is, for example, about 1000-5000 Å. Other thicknesses are also useful. An anti-reflective (ARC) layer can be formed beneath the soft sub-mask layer. The thickness of the ARC layer can be about 200-1500 Å. Other thicknesses are also useful.

Figure 2C:
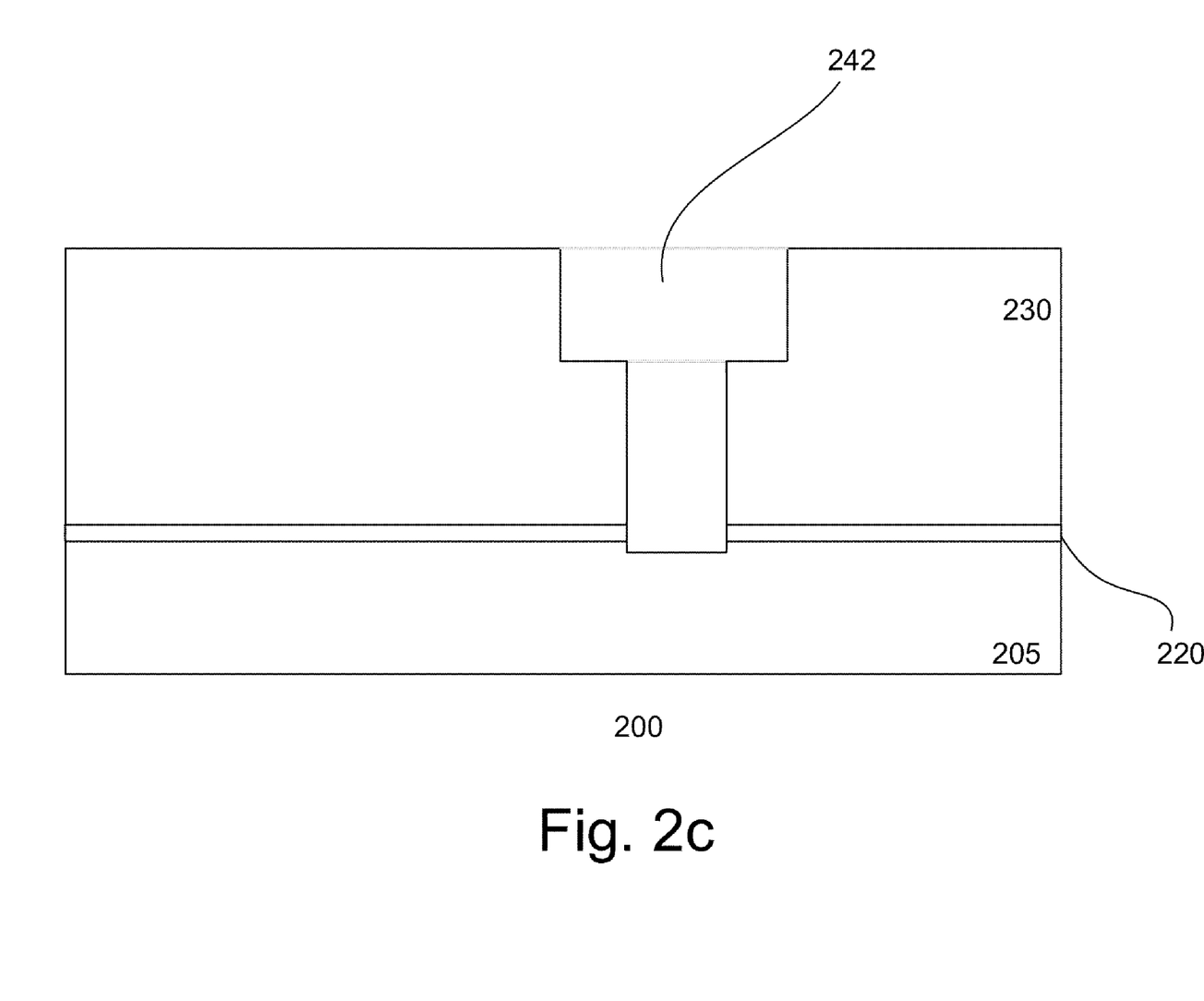

In FIG. 2c, the dielectric layer is patterned using mask 260 to form an opening 242. To pattern the dielectric layer, the soft sub-mask can be first patterned using lithographic techniques. The pattern of the soft sub-mask is then transferred to the hard sub-mask using, for example, reactive ion etching (RIE). The mask is then used to pattern the dielectric layer. The dielectric layer can be patterned by, for example, RIE. Other techniques for patterning the dielectric are also useful.

In one embodiment, the opening comprises a dual damascene opening. The dual damascene opening, for example, comprises a via opening in the ILD and a trench opening in the IMD. The dual damascene opening can be formed using various techniques. For example, the dual damascene opening can be formed using via first or via last techniques. Alternatively, the opening can be a damascene opening. For example, the damascene opening can be a via opening. Providing other types of openings, such as trench openings, are also useful. The opening may comprise slanted sidewalls. The slanted sidewalls, for example, comprise an angle of about 85-90°. Providing openings with non-slanted sidewalls as shown is also useful.

The opening should be sufficiently deep to enable contact to a contact region below the dielectric layer. For example, the opening should be deeper than the etch stop layer 220 to ensure exposure of the contact region.

In some applications, an intermediate etch stop layer (not shown) can be provided between the IMD and ILD. The intermediate etch stop layer comprises, in one embodiment, a UV resistant intermediate etch stop layer. The UV resistant intermediate etch stop layer can be, for example, a $—CH_3$ doped etch stop layer. In one embodiment, the etch stop layer comprises $(CH_3)_n SiC_x N_y H_z$. The thickness of the intermediate etch stop layer is about 150-500 Å. Other thicknesses are also useful.

The photoresist or soft mask layer is removed. The soft mask is removed by, for example, ashing. Other techniques for removing the soft sub-mask are also useful.

Figure 2D:
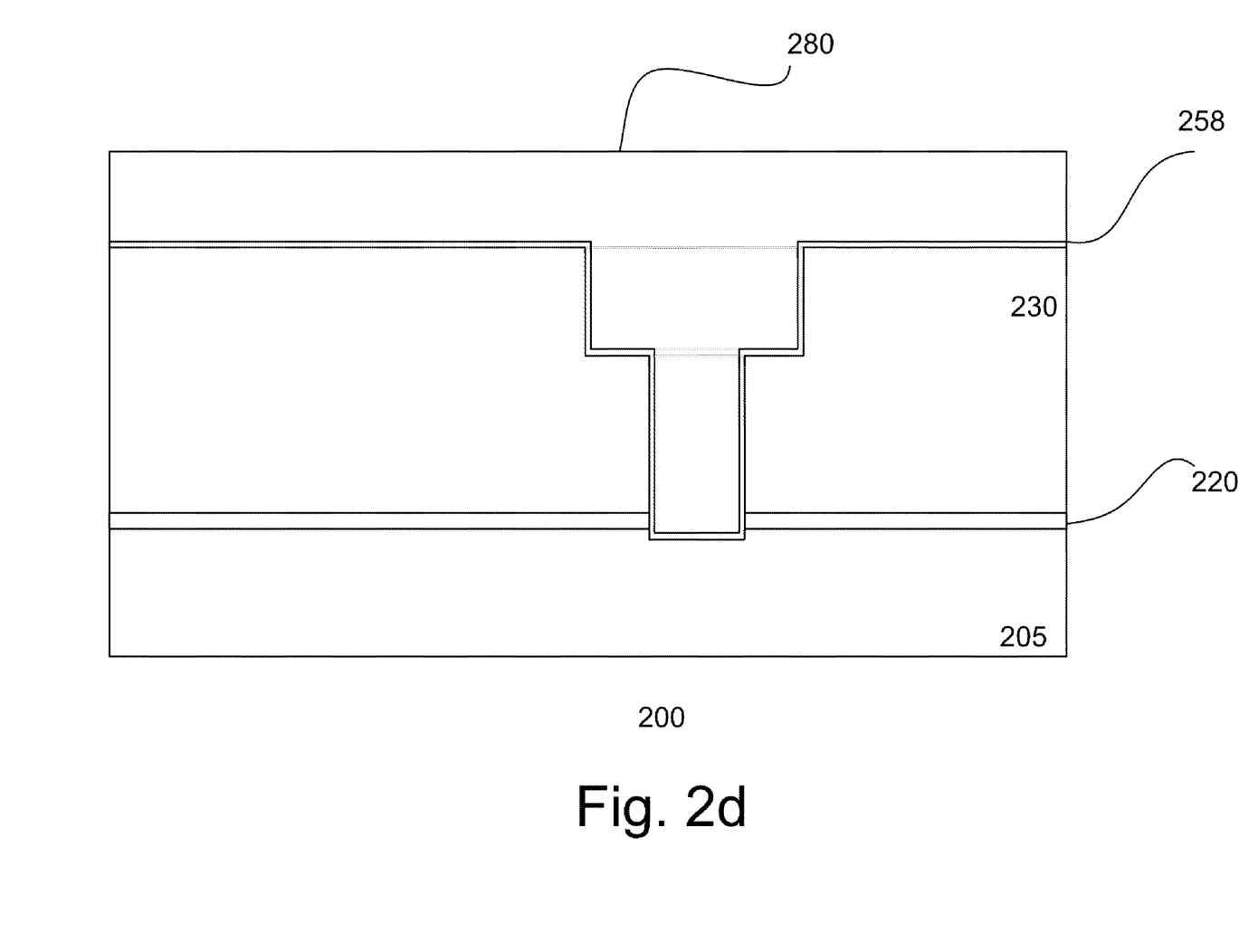

As shown in FIG. 2d, a barrier 258 can be deposited on the substrate, lining the surface of the dielectric layer and opening. The barrier, for example, can comprise TaN. Other types of barrier materials, such as tantalum, titanium nitride, ruthenium, or a combination thereof, are also useful. Providing a barrier layer having multiple layers is also useful. The barrier can be formed by, for example, PVD, CVD or atomic layer deposition (ALD). Other techniques for forming the barrier are also useful.

A conductive layer 280 is deposited on the substrate covering the barrier 258 and filling the dual damascene structure. The conductive material, for example, comprises copper, aluminum, tungsten, alloys such as Al doped Cu, Mn doped Cu, or a combination thereof. Other types of conductive materials, including metals and alloys, are also useful. In one embodiment, the conductive material comprises copper. The conductive material can be deposited by electroplating. Other techniques, such as electroless-plating, CVD, PVD or sputtering, are also useful. The technique employed may depend on the material used. For electro-plating techniques, a seed layer is first formed on the barrier layer. The seed layer, for example, can be formed by PVD.

Figure 2E:
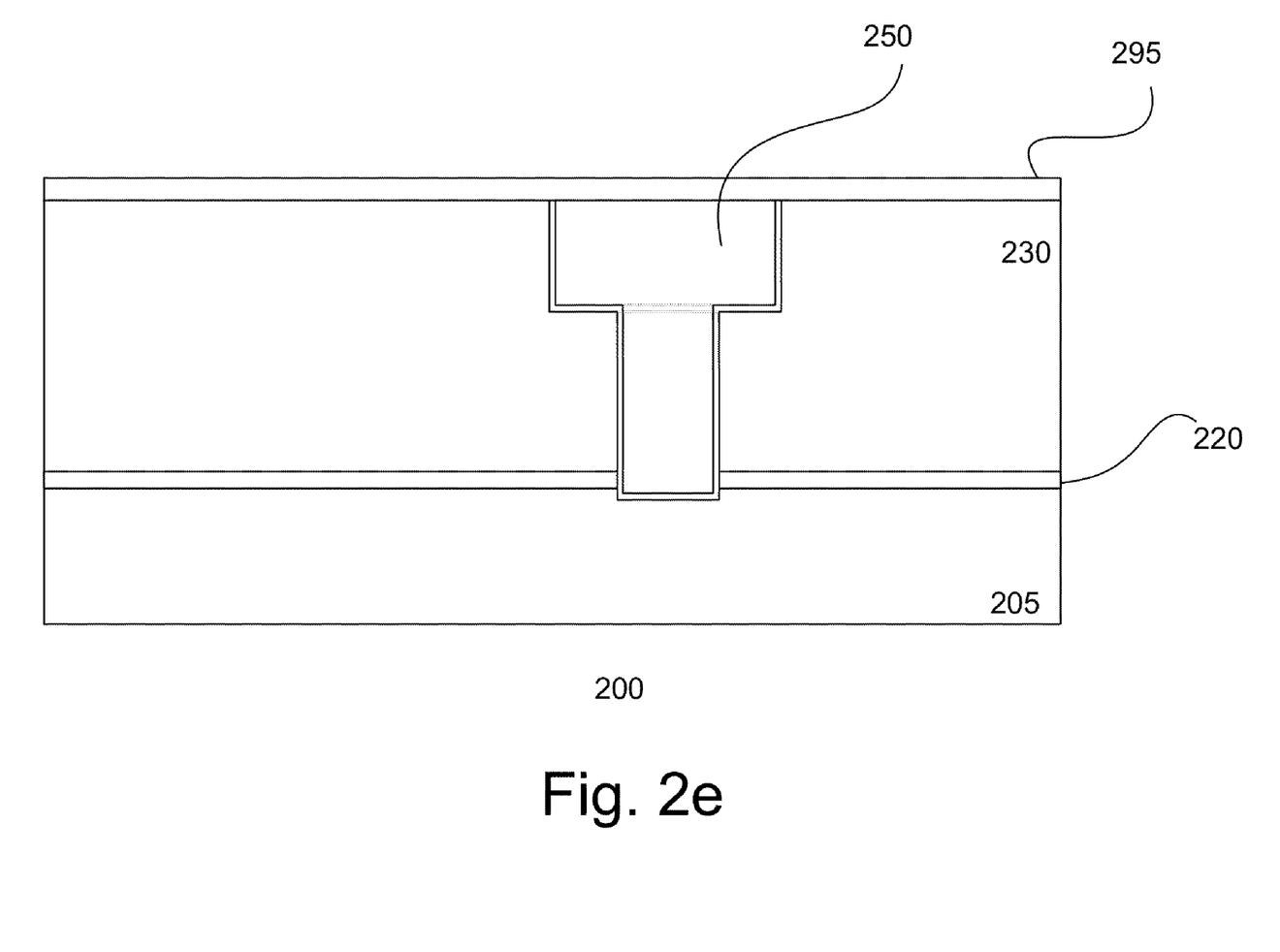

Referring to FIG. 2e, excess material on the surface of the dielectric layer is removed to form an interconnect 250. In one embodiment, the excess material is removed by a planarizing process to form a planar surface with the top of the dielectric layer. For example, excess conductive and barrier materials on the surface of the ICD layer are removed by a polishing process, such as chemical mechanical polishing (CMP), electro-CMP (eCMP) or a combination thereof. Other types of planarizing or polishing processes are also useful. The polishing process may include multiple polishing steps to remove the different materials, such as conductive and barrier materials.

After removing the excess material, a cap layer 295 is formed over the substrate surface. The cap layer covers the surface of the dielectric layer and the interconnect. In one embodiment, the cap layer comprises a UV resistant capping layer. For example, the capping layer comprises a $—CH_3$ doped device layer. In one embodiment, the device layer comprises $(CH_3)_n SiC_x N_y H_z$. The thickness of the capping layer can be about 150-500 Å. Other thicknesses are also useful.

The process continues to form the IC. For example, additional processing can include forming more ICD layers and interconnections, final passivation, dicing, assembly and packaging. Other processes are also useful.

Figure 3:
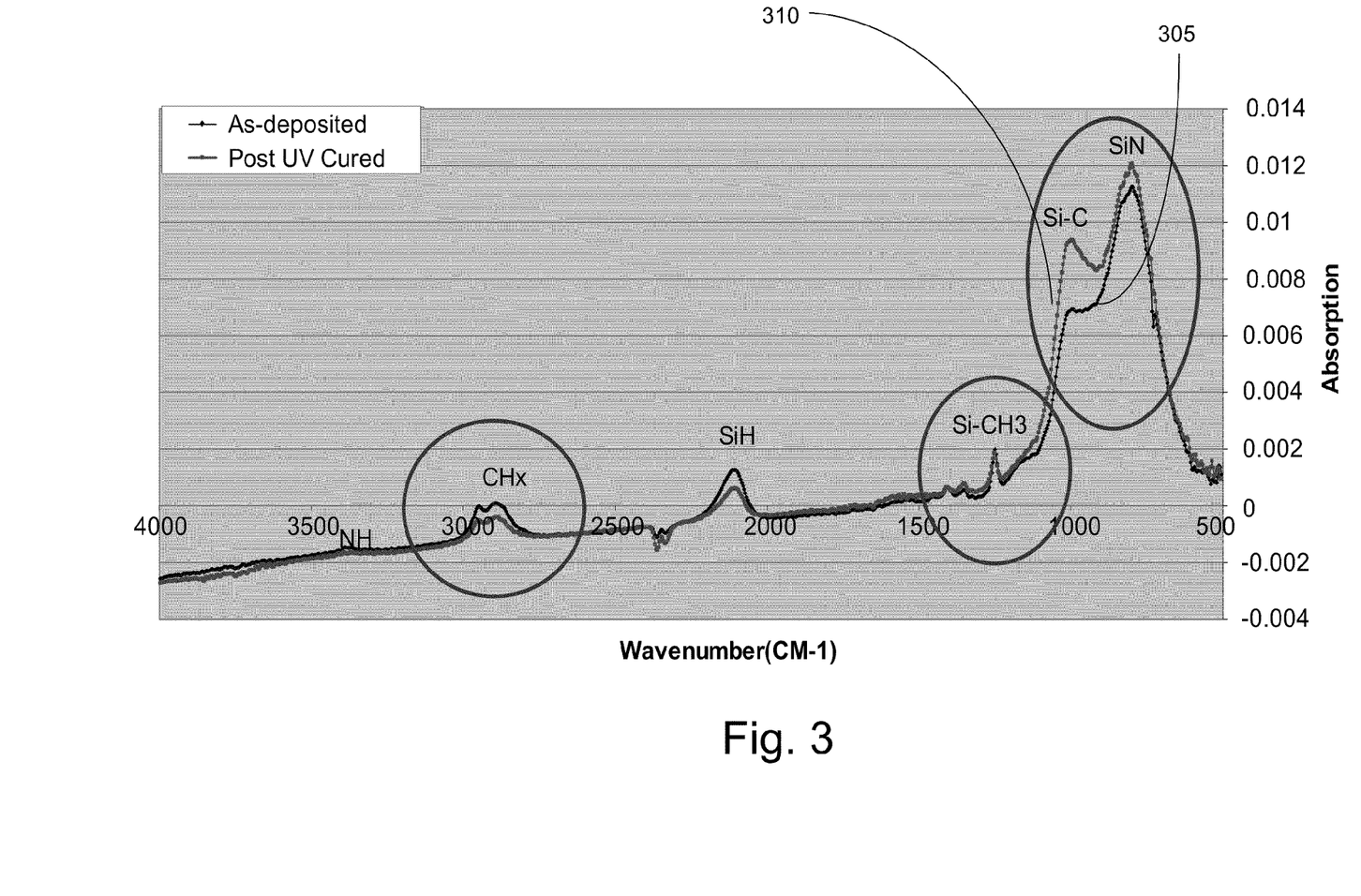
FIG. 3 shows the Fourier Transform Infrared (FTIR) spectroscopy at pre and post UV curing condition for —$CH_2$ doped $SiC_xN_yH_z$.

Referring to FIG. 3, which shows $—CH_x$ (x=1, 2) doped SiCN (using Alkene precursor $CH_2=CH_2$) pre and post UV curing FTIR spectroscopy. The x-axis represents wave number and the y-axis represents absorption. Curve 305 shows the FTIR of $—CH_x$ (x=1, 2) doped SiCN as deposited. Curve 310 shows the FTIR of $—CH_x$ (x=1, 2) doped SiCN following first curing. The three circled parts of the curve serves to highlight the major peak changes after UV curing. For instance, the FTIR indicates that the Si—$CH_x$ (where x=2 or 1) peaks at about 2927 $cm^{-1}$ of $—CH_x$ (x=1, 2) doped SiCN. Si—$CH_x$ (where x=2 or 1) undergoes decomposition upon UV curing to release H and convert to Si—C, which has much higher k than the original film. However, for $—CH_3$ doped SiCN, its Si—$CH_3$ bonds remain relatively stable upon UV curing. This is illustrated in the FTIR, which shows that the peak appearing at around 1250 $cm^{-1}$, which is associated with Si—$CH_3$, does not change after UV curing, indicating the Si—$CH_3$ is stable under UV curing.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
   providing a substrate prepared with circuit components;
   forming a doped device layer on the substrate;
   forming an interlevel dielectric layer on the doped device layer; and
   exposing the substrate with UV radiation to cure the interlevel dielectric layer, wherein properties of the doped device layer remain stable when exposed to UV radiation.

2. The method of claim 1 wherein the doped device layer comprises a low k dielectric layer.

3. The method of claim 1 wherein the doped device layer comprises a low k dielectric layer doped with $—CH_3$.

4. The method of claim 1 wherein the doped device layer comprises $(CH_3)_n SiC_x N_y H_z$.

5. The method of claim 1 wherein the interlevel dielectric layer comprises an ultra low k (ULK) dielectric layer.

6. The method of claim 5 wherein the doped device layer comprises a low k dielectric layer.

7. The method of claim 5 wherein the doped device layer comprises $(CH_3)_n SiC_x N_y H_z$.

8. The method of claim 1 wherein the doped device layer comprises a k of ≤4.5.

9. The method of claim 8 wherein properties of the doped device layer that remain stable include dielectric constant of the low k dielectric layer.

10. The method of claim 8 wherein properties of the doped device layer that remain stable include dielectric constant and stress of the low k dielectric layer.

11. The method of claim 8 wherein properties of the doped device layer remain stable when exposed to UV radiation for 30-600 seconds.

12. The method of claim 1 wherein forming the doped device layer comprises supplying a dopant source comprising an alky precursor.

13. The method of claim 12 wherein forming the doped device layer further comprises reacting device layer precursors with the alky precursor, wherein the device layer precursors comprise $(CH_3)_3 SiH$ or $(CH_3)_4 Si$ and $NH_3$.

14. The method of claim 12 wherein the dopant source comprises an alkyl precursor selected from $H_n C(CH_3)_{4-n}$ (n=0-4), $H_n(CH_3)_{3-n}C—H_{n'}(CH_3)_{3-n'}$ (n=1-3, n'=1-3), or RC—CR' alkyl.

15. The method of claim 14 wherein forming the doped device layer further comprises reacting device layer precursors with the alkyl precursor, wherein the device layer precursors comprise $(CH_3)_3 SiH$ or $(CH_3)_4 Si$ and $NH_3$.

16. A method for forming a semiconductor device comprising:
   providing a substrate;
   forming a doped device layer on the substrate; and
   exposing the substrate to UV radiation, wherein properties of the doped device layer are stable when exposed to the UV radiation.

17. The method of claim 16 wherein the doped device layer comprises $(CH_3)_n SiC_x N_y H_z$.

18. The method of claim 17 wherein a dopant source for forming the doped device layer comprises an alkyl precursor selected from $H_n C(CH_3)_{4-n}$ (n=0-4), $H_n(CH_3)_{3-n}C—H_{n'}(CH_3)_{3-n'}$ (n=1-3, n'=1-3), or RC—CR' alkyl.

19. The method of claim 18 wherein the dopant source comprises an alkyl precursor selected from $H_n C(CH_3)_{4-n}$ (n=0-4), $H_n(CH_3)_{3-n}C—H_{n'}(CH_3)_{3-n'}$ (n=1-3, n'=1-3), or RC—CR' alkyl.

20. A semiconductor device comprising:
   a substrate; and
   a doped low k dielectric layer doped with $—CH_3$, wherein properties of the doped low k dielectric layer are stable when exposed to UV radiation.

* * * * *